United States Patent
Park et al.

(10) Patent No.: US 11,448,706 B2
(45) Date of Patent: Sep. 20, 2022

(54) SYSTEM AND METHOD FOR CALCULATING INSULATION RESISTANCE

(71) Applicant: LG Chem, Ltd., Seoul (KR)

(72) Inventors: Jaedong Park, Daejeon (KR); Hyunki Cho, Daejeon (KR)

(73) Assignee: LG Energy Solution, Ltd.

( * ) Notice: Subject to any disclaimer, the term of this patent is extended or adjusted under 35 U.S.C. 154(b) by 627 days.

(21) Appl. No.: 16/466,873

(22) PCT Filed: Jan. 9, 2018

(86) PCT No.: PCT/KR2018/000409
§ 371 (c)(1),
(2) Date: Jun. 5, 2019

(87) PCT Pub. No.: WO2019/004544
PCT Pub. Date: Jan. 3, 2019

(65) Prior Publication Data
US 2020/0088803 A1    Mar. 19, 2020

(30) Foreign Application Priority Data

Jun. 27, 2017 (KR) .................. 10-2017-0081172

(51) Int. Cl.
  *G01R 31/389*    (2019.01)
  *G01R 31/12*     (2020.01)
  *G01R 31/36*     (2020.01)
(52) U.S. Cl.
  CPC ....... *G01R 31/389* (2019.01); *G01R 31/1272* (2013.01); *G01R 31/3644* (2013.01)

(58) Field of Classification Search
  CPC .............. G01R 31/389; G01R 31/1272; G01R 31/3644
  See application file for complete search history.

(56) References Cited

U.S. PATENT DOCUMENTS 10,101,378 B2 * 10/2018 Jung ................ G01R 31/12
10,374,442 B2 *  8/2019 Averitt ............. B60L 58/18
2013/0176041 A1  7/2013 Yang
(Continued)

FOREIGN PATENT DOCUMENTS

CN    101274724 A    10/2008
CN    102539918 A     7/2012
(Continued)

OTHER PUBLICATIONS

Xin, et al., "Study on Insulation Detection Method of Electric Vehicles Based on Single Point of Failure Model," 2016 11th International Forum on Strategic Technology (IFOST), IEEE, Jun. 1, 2016, pp. 191-194.
(Continued)

*Primary Examiner* — Bryan Bui
(74) *Attorney, Agent, or Firm* — Lerner, David, Littenberg, Krumholz & Mentlik, LLP

(57) ABSTRACT

A system and a method for calculating insulation resistance, and more particularly for calculating insulation resistance between a positive terminal and a negative terminal of a battery and a chassis based on voltages of the battery applied to a resistor that connects the positive terminal of the battery and the chassis and a resistor that connects the negative terminal of the battery and the chassis.

14 Claims, 4 Drawing Sheets

(56) References Cited

U.S. PATENT DOCUMENTS

| | | |
|---|---|---|
| 2013/0300430 A1 | 11/2013 | Lindsay et al. |
| 2013/0314097 A1 | 11/2013 | Hausberger et al. |
| 2014/0333321 A1* | 11/2014 | Kawamura ............... B60L 3/04 324/509 |
| 2017/0016951 A1 | 1/2017 | Sung et al. |
| 2017/0160327 A1 | 6/2017 | Jung et al. |

FOREIGN PATENT DOCUMENTS

| | | |
|---|---|---|
| CN | 102769428 A | 11/2012 |
| CN | 103048545 A | 4/2013 |
| CN | 103250061 A | 8/2013 |
| CN | 204389589 U | 6/2015 |
| CN | 106291112 A | 1/2017 |
| CN | 106461733 A | 2/2017 |
| CN | 106645963 A | 5/2017 |
| CN | 106645964 A | 5/2017 |
| JP | 2010-019603 A | 1/2010 |
| KR | 20130059107 A | 6/2013 |
| KR | 20140041213 A | 4/2014 |
| KR | 20140068567 A | 6/2014 |
| KR | 10-1416816 B1 | 8/2014 |
| KR | 20150065676 A | 6/2015 |
| KR | 20150081988 A | 7/2015 |
| KR | 10-1619420 B1 | 5/2016 |
| KR | 2016-0047633 A | 5/2016 |
| KR | 20170057004 A | 5/2017 |

OTHER PUBLICATIONS

Supplementary European Search Report with written opinion for Application No. 18825440.3 dated Nov. 14, 2019, 8 pages.
Chinese Search Report for Application No. 2018800046181.1, dated Dec. 1, 2019, 8 pages.
International Search Report in PCT/KR2018/000409, dated Apr. 19, 2018, 2 pages.

* cited by examiner

[Figure 1]
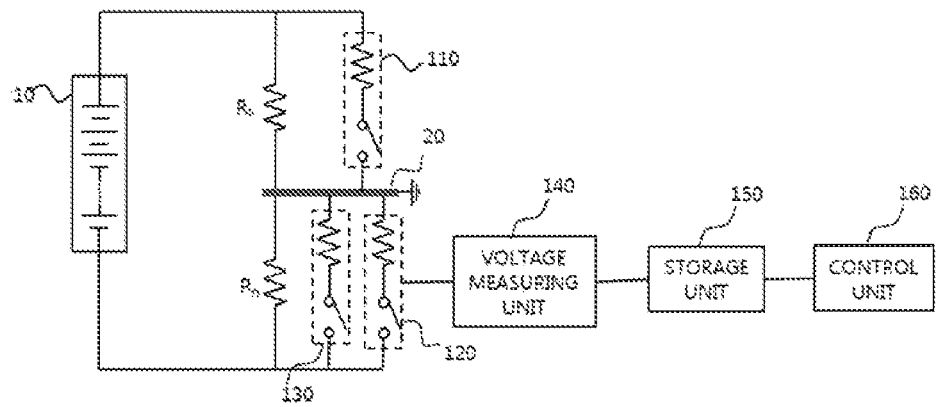

[Figure 2]
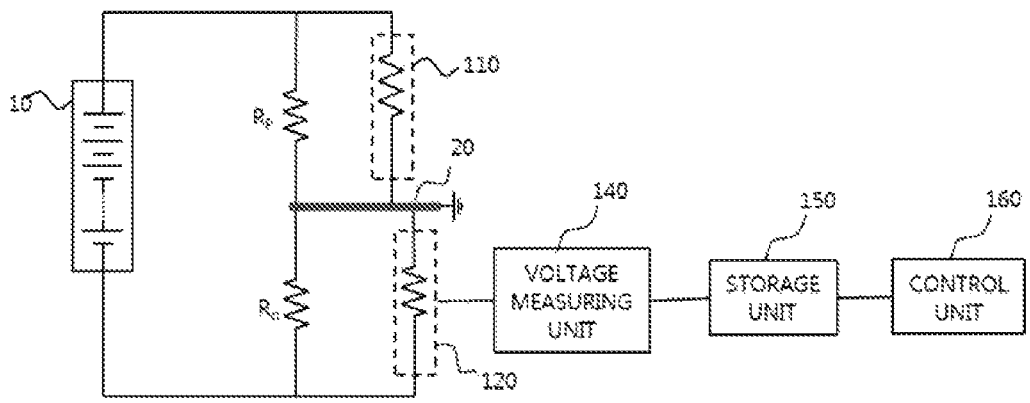

[Figure 3]
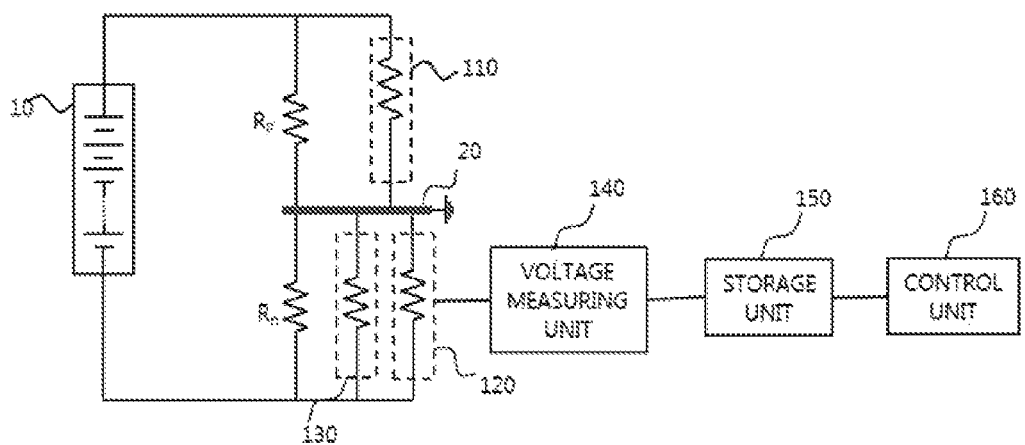

[Figure 4]
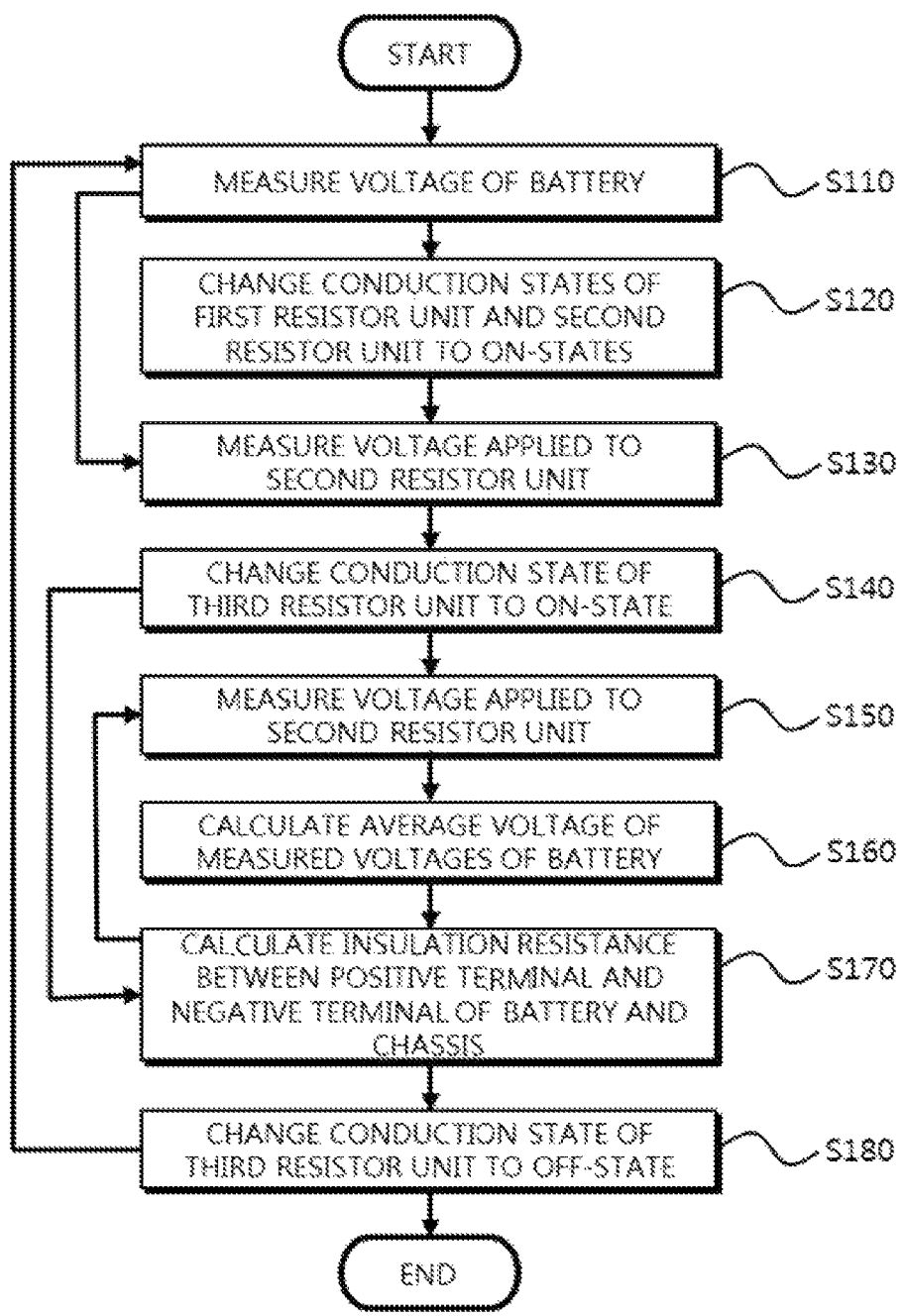

SYSTEM AND METHOD FOR CALCULATING INSULATION RESISTANCE

CROSS-REFERENCE TO RELATED APPLICATIONS

The present application is a national phase entry under 35 U.S.C. § 371 of International Application No. PCT/KR2018/000409 filed Jan. 9, 2018, published in Korean, which claims priority from Korean Patent Application No. 10-2017-0081172 filed Jun. 27, 2017, all of which are incorporated herein by reference.

The present invention relates to a system and a method for calculating insulation resistance, and more particularly, to a system and a method for calculating insulation resistance, which calculate insulation resistance between a positive terminal and a negative terminal of a battery and a chassis based on voltages of the battery applied to a resistor that connects the positive terminal of the battery and the chassis and a resistor that connects the negative terminal of the battery and the chassis.

BACKGROUND ART

In general, a secondary battery may be used as one battery module by joining a plurality of unit secondary battery cells in an environment requiring a high capacity, such as an electric vehicle, an energy storage system, and an uninterruptible power supply, and the plurality of battery modules may be joined and used depending on the case.

When the plurality of battery modules is joined and is used as a high-voltage battery, insulation resistance of a predetermined level or more needs to be maintained in order to prevent a user from getting an electric shock and prevent a battery from being undesirably discharged. For example, when a high-voltage battery including the plurality of joined battery modules is applied to and used in a vehicle, it is necessary to measure insulation resistance between a positive electrode of a battery and a chassis of a vehicle and insulation resistance between a negative electrode of a battery and a chassis of a vehicle and maintain the insulation resistance at a predetermined level or higher.

In a method of measuring insulation resistance between a positive electrode and a negative electrode of a battery and a chassis in a battery management system (BMS) in the related art, measurement resistance within a BMS is connected to a positive electrode and a negative electrode of a battery and based on the chassis and a connection state of the measurement resistance within the BMS is sequentially changed by controlling switching to calculate insulation resistance.

In the meantime, the method of calculating insulation resistance in the related art has a problem in that the method may be applied only to a BMS using a chassis as a reference voltage, and it is impossible to calculate insulation resistance in a device, such as a battery disconnecting unit (BDU) which is not connected with a chassis.

In this respect, in order to solve the problems of the method of calculating insulation resistance in the related art, the present inventor developed a system and a method for calculating insulation resistance which may calculate insulation resistance between a positive terminal of a battery and a chassis and insulation resistance between a negative terminal of the battery and a chassis based on a voltage of the negative terminal side of the battery without being based on the chassis.

DETAILED DESCRIPTION OF THE INVENTION

Technical Problem

The present invention is conceived to solve the foregoing problems, and provides a system and a method for calculating insulation resistance which may calculate insulation resistance between a positive terminal of a battery and a chassis and insulation resistance between a negative terminal of the battery and a chassis by calculating insulation resistance by using voltages of a battery measured according to conduction states of first to third resistor units connected between the positive terminal and the negative terminal of the battery and the chassis based on a voltage of the negative terminal side of the battery.

Technical Solution

An exemplary embodiment of the present invention provides a system for calculating insulation resistance, the system including: a first resistor unit configured to connect a positive terminal of a battery and a chassis; a second resistor unit configured to connect a negative terminal of the battery and the chassis; a third resistor unit configured to connect the negative terminal of the battery and the chassis, whereby the third resistor unit is connected with the second resistor unit in parallel; and a control unit configured to control conduction states of the first, second and third resistor units, in which the control unit is further configured to calculate an insulation resistance between the positive terminal of the battery and the chassis, and an insulation resistance between the negative terminal of the battery and the chassis, relative to a voltage of a negative terminal side of the battery, by using the voltage of the battery applied to the second resistor unit according to the conduction states of the first, second and third resistor units.

In the exemplary embodiment, the system may further include: a voltage measuring unit configured to measure a voltage of the battery applied to the second resistor unit according to the conduction states of the first, second and third resistor units; and a storage unit configured to store the measured voltage of the battery.

In the exemplary embodiment, the voltage measuring unit may be configured to sequentially measure a voltage of the battery, a voltage of the battery applied to the second resistor unit when each of the first and second resistor units is in a conduction state of an on-state, and a voltage of the battery applied to the second resistor unit when each of the first, second and third resistor units is in the on-state, and the control unit may be configured to control the voltage measuring unit so as to measure the voltage at a predetermined time interval.

In the exemplary embodiment, the voltage measuring unit may be configured to measure the voltage of the battery regardless of the conduction states of the first, second and third resistor units, and the control unit may be configured to calculate an average voltage of the battery based on the measured voltage of the battery, and calculate the insulation resistance between the positive terminal of the battery and the chassis and the insulation resistance between the negative terminal of the battery and the chassis by using the calculated average voltage.

In the exemplary embodiment, the control unit may be configured to calculate the insulation resistance between the positive terminal of the battery and the chassis based on Equation 1 below.

$$R_n = \frac{R_E \cdot R_f \cdot \left(\frac{(V/V_{GEF} - 1)}{V/V_{GE} - 1} - 1\right)}{R_E - R_f \cdot \left(\frac{(V/V_{GEF} - 1)}{V/V_{GE} - 1} - 1\right)} \quad \langle\text{Equation 1}\rangle$$

wherein, Rn is the insulation resistance between the positive terminal of the battery and the chassis, $R_E$ is a resistance value of the second resistor unit, $R_F$ is a resistance value of the third resistor unit, V is a voltage value of the battery, $V_{GEF}$ is a voltage value applied to the second resistor unit when each of the first, second and third resistor units is in the on-state, and $V_{GE}$ is a voltage value applied to the second resistor unit when each of the first and second resistor units is in the on-state.

In the exemplary embodiment, the control unit may be configured to calculate the insulation resistance between the negative terminal of the battery and the chassis based on Equation 2 below.

$$R_P = \frac{R_G \cdot (V/V_{GE} - 1) \cdot R_f \cdot \left(\frac{(V/V_{GEF} - 1)}{V/V_{GE} - 1} - 1\right)}{R_G - (V/V_{GE} - 1) \cdot R_f \cdot \left(\frac{(V/V_{GEF} - 1)}{V/V_{GE} - 1} - 1\right)} \quad \langle\text{Equation 2}\rangle$$

wherein, $R_P$ is the insulation resistance between the negative terminal of the battery and the chassis, $R_G$ is a resistance value of the first resistor unit, $R_F$ is a resistance value of the third resistor unit, V is a voltage value of the battery, $V_{GEF}$ is a voltage value applied to the second resistor unit when each of the first, second and third resistor units is in the on-state, and $V_{GE}$ is a voltage value applied to the second resistor unit when each of the first and second resistor units is in the on-state.

In the exemplary embodiment, each of the first, second and third resistor units may include one or more resistors and switching units, and the one or more resistors may be embedded in a battery management system (BMS) configured to manage the battery.

Another exemplary embodiment of the present invention provides a method of calculating insulation resistance, the method including: controlling a conduction state of each of a first resistor unit which connects a positive terminal of a battery and a chassis of a vehicle, a second resistor unit which connects a negative terminal of the battery and the chassis, and a third resistor unit which is connected with the second resistor unit in parallel; measuring a voltage of the battery applied to the second resistor unit; and calculating an insulation resistance between the positive terminal of the battery and the chassis and an insulation resistance between the negative terminal of the battery and the chassis, in which the calculating includes calculating the insulation resistance between the positive terminal of the battery and the chassis relative to a voltage of a negative terminal side of the battery and the negative terminal of the battery and the chassis by using the voltage of the battery applied to the second resistor unit according to the conduction states of the first, second and third resistor units.

In the exemplary embodiment, the measuring may include measuring the voltage of the battery applied to the second resistor unit according to the conduction states of the first, second and third resistor units, and the method may further include storing the measured voltage of the battery.

In the exemplary embodiment, the measuring may further include sequentially measuring, by the voltage measuring unit, a voltage of the battery, a voltage of the battery applied to the second resistor unit when a conduction state of each of the first and second resistor units is an on-state, and a voltage of the battery applied to the second resistor unit when a conduction state of each of the first, second and third resistor units is the on-state, and the calculating may further include controlling the voltage measuring unit so as to measure the voltage at a predetermined time interval.

In the exemplary embodiment, the measuring may further include measuring the voltage of the battery regardless of the conduction states of the first, second and third resistor units, and the calculating may further include calculating an average voltage of the battery based on the measured voltage of the battery, and calculating the insulation resistance between the positive terminal of the battery and the chassis and the insulation resistance between the negative terminal of the battery and the chassis by using the calculated average voltage.

In the exemplary embodiment, the calculating may include calculating the insulation resistance between the positive terminal of the battery and the chassis based on Equation 1 below.

$$R_n = \frac{R_E \cdot R_F \cdot \left(\frac{(V/V_{GEF} - 1)}{V/V_{GE} - 1} - 1\right)}{R_E - R_F \cdot \left(\frac{(V/V_{GEF} - 1)}{V/V_{GE} - 1} - 1\right)} \quad \langle\text{Equation 1}\rangle$$

wherein, Rn is the insulation resistance between the positive terminal of the battery and the chassis, $R_E$ is a resistance value of the second resistor unit, $R_F$ is a resistance value of the third resistor unit, V is a voltage value of the battery, $V_{GEF}$ is a voltage value applied to the second resistor unit when each of the first, second and third resistor units is in the on-state, and $V_{GE}$ is a voltage value applied to the second resistor unit when each of the first and second resistor units is in the on-state.

In the exemplary embodiment, the calculating may include calculating the insulation resistance between the negative terminal of the battery and the chassis based on Equation 2 below.

$$R_P = \frac{R_G \cdot (V/V_{GE} - 1) \cdot R_f \cdot \left(\frac{(V/V_{GEF} - 1)}{V/V_{GE} - 1} - 1\right)}{R_G - (V/V_{GE} - 1) \cdot R_f \cdot \left(\frac{(V/V_{GEF} - 1)}{V/V_{GE} - 1} - 1\right)} \quad \langle\text{Equation 2}\rangle$$

wherein, $R_P$ is the insulation resistance between the negative terminal of the battery and the chassis, $R_G$ is a resistance value of the first resistor unit, $R_F$ is a resistance value of the third resistor unit, V is a voltage value of the battery, $V_{GEF}$ is a voltage value applied to the second resistor unit when each of the first, second and third resistor units is in the on-state, and $V_{GE}$ is a voltage value applied to the second resistor unit when each of the first and second resistor units is in the on-state.

In the exemplary embodiment, each of the first, second and third resistor units may include one or more resistors and switching units, and the one or more resistors may be embedded in a battery management system (BMS) configured to manage the battery.

Advantageous Effects

The present invention may calculate insulation resistance between a positive terminal of a battery and a chassis and insulation resistance between a negative terminal of the battery and the chassis by calculating insulation resistance by using a voltage of the battery measured according to the conduction states of first to third resistor units connected between the positive terminal and the negative terminal of the battery and the chassis based on a voltage of the negative terminal side of the battery.

Further, the present invention may calculate insulation resistance by using a resistor embedded in a battery management system (BMS) managing a battery, thereby achieving an advantage in that it is possible to calculate even insulation resistance between a product that is not connected to a chassis and the battery.

Further, the present invention uses a voltage of a negative terminal side of a battery as a reference, thereby achieving an advantage in that it is possible to calculate even insulation resistance of another BMS product connected to the negative terminal side of the battery.

BRIEF DESCRIPTION OF DRAWINGS

FIG. 1 is a diagram schematically illustrating constitution elements of an insulation resistance calculating system 100 according to an exemplary embodiment of the present invention.

FIG. 2 is a diagram schematically illustrating a case where conduction states of first and second resistor units 110 and 120 are on-states in the insulation resistance calculating system 100 according to the exemplary embodiment of the present invention.

FIG. 3 is a diagram schematically illustrating a case where conduction states of first to third resistor units 110 to 130 are on-states in the insulation resistance calculating system 100 according to the exemplary embodiment of the present invention.

FIG. 4 is a flowchart for describing a series of processes for calculating insulation resistance between a positive terminal and a negative terminal of a battery and a chassis by using the insulation resistance calculating system 100 according to the exemplary embodiment of the present invention.

MODE FOR CARRYING OUT THE INVENTION

Hereinafter, an exemplary embodiment is presented for helping understanding of the present invention. However, the exemplary embodiment below is simply provided for easy understanding of the present invention, and the contents of the present invention are not limited by the exemplary embodiment.

FIG. 1 is a diagram schematically illustrating constitution elements of an insulation resistance calculating system 100 according to an exemplary embodiment of the present invention, FIG. 2 is a diagram schematically illustrating a case where conduction states of first and second resistor units 110 and 120 are on-states in the insulation resistance calculating system 100 according to the exemplary embodiment of the present invention, and FIG. 3 is a diagram schematically illustrating a case where conduction states of first to third resistor units 110 to 130 are on-states in the insulation resistance calculating system 100 according to the exemplary embodiment of the present invention.

Referring to FIGS. 1 to 3, the insulation resistance calculating system 100 according to the exemplary embodiment of the present invention may include a first resistor unit 110, a second resistor unit 120, a third resistor unit 130, a voltage measuring unit 140, a storage unit 150, and a control unit 160.

The insulation resistance calculating system 100 illustrated in FIGS. 1 to 3 is described based on the exemplary embodiment, and the constitution elements thereof are not limited to the exemplary embodiment illustrated in FIGS. 1 to 3, and may be replaced, added, changed, or deleted as necessary. For example, in the insulation resistance calculating system 100 according to the exemplary embodiment of the present invention, a voltage of a battery 10 measured by the voltage measuring unit 140 may be transmitted to the control unit 160 to calculate insulation resistance without including the separate storage unit 150. Further, the insulation resistance calculating system 100 according to the exemplary embodiment of the present invention may be configured so that the voltage measuring unit 140 is not included, and a voltage of the battery 10 applied to the second resistor unit 120 is transmitted to the control unit 160, the transmitted voltage of the battery 10 is stored in the storage unit 150, and then data stored in the storage unit 150 is used when insulation resistance is calculated later.

First, the first resistor unit 110 may connect a positive terminal of the battery 10 and a chassis 20 of a vehicle, the second resistor unit 120 may connect a negative terminal of the battery 10 and the chassis 20, and the third resistor unit 130 may connect the negative terminal of the battery and the chassis 20 and may be connected with the second resistor unit 120 in parallel.

Herein, the chassis 20 means a car body forming a basis of the vehicle and may mean a chassis in a state where a vehicle body of the vehicle is not mounted in a structure of the vehicle. Further, the chassis 20 may mean a form in which various constituent elements, such as an engine, a transmission, and a clutch, are combined with a frame that is a basic frame. In the insulation resistance calculating system 100 according to the exemplary embodiment of the present invention, the first to third resistor units 110 to 130 are configured to be connected with the chassis 20 of the vehicle, but are not limited thereto, and the first to third resistor units 110 to 130 may be applied and connected to another product and device, not the vehicle.

The first to third resistor units 110 to 130 may be controlled by the control unit 160 which is to be described below, so that conduction states thereof may be changed. To this end, each of the first to third resistor units 110 to 130 may include one or more resistors and switching units.

Herein, the conduction state may mean an on-state in which the first to third resistor units 110 to 130 connect the positive terminal and the negative terminal of the battery 10 and the chassis 20, and an off-state in which the first to third resistor units 110 to 130 disconnect the positive terminal and the negative terminal of the battery 10 and the chassis 20.

Herein, the one or more resistors may determine the number of resistors and a size of the resistor in consideration of a usage environment by a manufacturer or a user of the insulation resistance calculating system 100 according to the exemplary embodiment of the present invention. For example, each of the first to third resistor units 110 to 130 may include only one resistor, and a size of one resistor included in each of the first to third resistor units 110 to 130 may be the same.

In the exemplary embodiment, when the insulation resistance calculating system 100 according to the exemplary embodiment of the present invention is applied to a vehicle using a high-voltage battery, the first to third resistor units 110 to 130 may be forms embedded in a battery management system (BMS) which monitor and manage the battery 10. Accordingly, a separate space for providing the first to third resistor units 110 to 130 is not required, thereby improving utilization of space. Further, a product which is not connected with the chassis 20 is also connected with the first to third resistor units 110 to 130 embedded in the BMS, thereby achieving an advantage in that it is possible to calculate insulation resistance between the battery 10 and the product.

The voltage measuring unit 140 may measure a voltage applied to the second resistor unit 120 according to the conduction states of the first to third resistor units 110 to 130.

The voltage measuring unit 140 may sequentially measure a voltage of the battery 10, a voltage of the battery 10 applied to the second resistor unit 120 when the conduction states of the first and second resistor units 110 and 120 are the on-states, and a voltage of the battery 10 applied to the second resistor unit 120 when the conduction states of the first to third resistor units 110 to 130 are the on-states in a predetermined order.

Herein, the predetermined order may be the order of controlling the conduction states of the first to third resistor units 110 to 130 in order to measure the voltage of the battery 10, the voltage of the battery 10 applied to the second resistor unit 120 when the conduction states of the first and second resistor units 110 and 120 are the on-states, and the voltage of the battery 10 applied to the second resistor unit 120 when the conduction states of the first to third resistor units 110 to 130 are the on-states. For example, the predetermined order may be the order of an operation of measuring the voltage of the battery 10, an operation of changing the conduction states of the first and second resistor units 110 and 120 to the on-states and measuring the voltage of the battery 10 applied to the second resistor unit 120, and an operation of changing the conduction state of the third resistor unit 130 to the on-state and measuring the voltage of the battery 10 applied to the second resistor unit 120, and the voltage measuring unit 140 may measure the voltages based on the predetermined order.

The voltage measuring unit 140 may measure the voltage applied to the second resistor unit 120 according to the conduction states of the first to third resistor units 110 to 130, and may measure the voltage applied to the second resistor unit 120 at a predetermined time interval whenever the conduction states of the first to third resistor units 110 to 130 are changed.

Herein, the predetermined time interval may be a time value set by a manufacturer or a user of the insulation resistance calculating system 100 according to the exemplary embodiment of the present invention based on a size of capacitance and the sizes of the first to third resistor units 110 to 130. For example, in the case where a size of the resistor and a size of capacitance are large, when a voltage is suddenly applied to the resistor (when a state of a switch is changed to an on-state and a voltage is applied), a low voltage may be applied to the resistor instead of a complete voltage, and the applied voltage is gradually increased over time and reaches a voltage having a size that had needed to be originally applied. That is, a predetermined time may be required in order to measure the voltage having the size that had needed to be originally applied.

Accordingly, the voltage measuring unit 140 may measure the voltage when the voltage having the size that had needed to be originally applied to the second resistor unit 120 is applied by measuring the voltage applied to the second resistor unit 120 at the predetermined time interval, thereby preventing an error of a measurement value.

In the exemplary embodiment, the voltage measuring unit 140 may measure the voltage of the battery 10 regardless of the conduction states of the first to third resistor units 110 to 130, and an average voltage of the voltages of the battery 10 measured by the voltage measuring unit 140 may be calculated and used for calculating insulation resistance via the control unit 160 which is to be described below.

The storage unit 150 may store the voltage of the battery 10 measured by the voltage measuring unit 140. Further, the storage unit 150 may store the insulation resistance calculated via the control unit 160 which is to be described below. For example, the storage unit 150 may be a database DB which makes the voltage of the battery 10 measured by the voltage measuring unit 140 and the insulation resistance calculated by the control unit 160 into data and stores the voltage of the battery 10 and the insulation resistance in the form of data.

Herein, the storage unit 150 may store all of the elements, such as the voltage applied to the second resistor unit 120 measured by the voltage measuring unit 140, the voltage of the battery 10, the calculated insulation resistance, an equation for calculating insulation resistance, measured and calculated in the insulation resistance calculating system 100 according to the exemplary embodiment of the present invention.

The control unit 160 may control the conduction states of the first to third resistor units 110 to 130. For example, the control unit 160 may output a control signal controlling an on/off operation of the switching unit included in each of the first to third resistor units 110 to 130, and the switching unit included in each of the first to third resistor units 110 to 130 performs the on/off operation based on the received control signal, thereby changing the conduction states of the first to third resistor units 110 to 130.

The control unit 160 may calculate insulation resistance between the positive terminal of the battery 10 and the chassis 20 and insulation resistance between the negative terminal of the battery 10 and the chassis 20 by using the voltage of the battery 10 applied to the second resistor unit 120 according to the conduction states of the first to third resistor units 110 to 130, based on the voltage of the negative terminal side of the battery 10. Hereinafter, a process of calculating insulation resistance between the positive terminal of the battery 10 and the chassis 20 and insulation resistance between the negative terminal of the battery 10 and the chassis 20 based on Equations 1 to 10 will be described.

First, the control unit 160 may calculate insulation resistance between the positive terminal of the battery 10 and the chassis 20 based on Equation 1 below.

$$R_n = \frac{R_E \cdot R_F \cdot \left( \frac{(V/V_{GEF} - 1)}{V/V_{GE} - 1} - 1 \right)}{R_E - R_F \cdot \left( \frac{(V/V_{GEF} - 1)}{V/V_{GE} - 1} - 1 \right)} \qquad \langle \text{Equation 1} \rangle$$

Herein, $R_n$ is insulation resistance between the positive terminal of the battery 10 and the chassis 20, $R_E$ is a resistance value of the second resistor unit 120, $R_F$ is a resistance value of the third resistor unit 130, V is a voltage value of the battery 10, $V_{GEF}$ is a voltage value applied to the second resistor unit 120 when the first to third resistor units 110 to 130 are in the on-states, and $V_{GE}$ is a voltage value applied to the second resistor unit 120 when the first and second resistor units 110 and 120 are in the on-states.

More particularly, as illustrated in FIG. 2, when the first resistor unit 110 and the second resistor unit 120 are in the on-states and the third resistor unit 130 is in the off-state, the voltage applied to the second resistor unit 120 may be calculated by using Equation 3 below.

$$\frac{(R_n // R_E)}{(R_n // R_E) + (R_P // R_G)} \cdot V = V_{GE} \quad \langle \text{Equation 3} \rangle$$

Herein, $R_G$ is a resistance value of the first resistor unit 110.

Further, as illustrated in FIG. 3, when the first to third resistor units 110 to 130 are in the on-states, the voltage applied to the second resistor unit 120 may be calculated by using Equation 4 below.

$$\frac{(R_n // R_E) // R_F}{(R_n // R_E) // R_F + (R_P // R_G)} \cdot V = V_{GEF} \quad \langle \text{Equation 4} \rangle$$

Herein, when $(R_n/R_E)$ written in Equations 3 and 4 is substituted with X, $(R_P/R_G)$ written in Equations 3 and 4 is substituted with Y, and the substituted X and Y are put into Equation 3, Equation 5 below may be derived.

$$\frac{X + Y}{X} = \frac{V}{V_{GE}} \quad \langle \text{Equation 5} \rangle$$

Further, when the substituted X and Y are put into Equation 4, Equation 6 below may be derived.

$$\frac{(X // R_F) + Y}{(X // R_F)} = \frac{V}{V_{GEF}} \quad \langle \text{Equation 6} \rangle$$

In this case, when Equations 5 and 6 are organized based on Y, Equations 7 and 8 below may be derived, respectively.

$$Y = \left(\frac{V}{V_{GE}} - 1\right) \cdot X \quad \langle \text{Equation 7} \rangle$$

$$Y = \left(\frac{V}{V_{GE}} - 1\right) \cdot (X // R_F) \quad \langle \text{Equation 8} \rangle$$

When Equations 7 and 8 derived by the foregoing method are combined, the substituted Y is erased, so that Equation 9 may be derived, and when Equation 9 below is organized based on X, Equation 10 below may be derived.

$$\left(\frac{V}{V_{GE}} - 1\right) \cdot X - \left(\frac{V}{V_{GEF}} - 1\right) \cdot (X // R_F) = 0 \quad \langle \text{Equation 9} \rangle$$

$$X = \frac{R_F \cdot \left(\frac{V}{V_{GEF}} - 1\right)}{\left(\frac{V}{V_{GE}} - 1\right)} - R_F \quad \langle \text{Equation 10} \rangle$$

Herein, when X is erased by combining Equations 3 and 10 and the combined equation is organized based on $R_n$, foregoing Equation 1 may be derived.

That is, the control unit 160 may calculate insulation resistance between the positive terminal of the battery 10 and the chassis 20 by putting the voltage V of the battery 10, the voltage $V_{GE}$ of the battery applied to the second resistor unit 120 when the conduction states of the first and second resistor units 110 and 120 are the on-states, and the voltage $V_{GEF}$ of the battery 10 applied to the second resistor unit 120 when the conduction states of the first to third resistor units 110 to 130 are the on-states measured by the voltage measuring unit 140 into foregoing Equation 1.

In the exemplary embodiment, when the insulation resistance calculating system 100 according to the exemplary embodiment of the present invention does not include the voltage measuring unit 140 and directly transmits the voltage of the battery 10 applied to the second resistor unit 120 to the control unit 160, the voltage V of the battery 10 included in foregoing Equations 1 to 10 may be a value obtained by multiplying a size C of the actual voltage of the battery 10 by a predetermined partial pressure ratio D. For example, when the control unit 160 is a micro controller unit (MCU) included in the BMS and the actual voltage C of the battery is completely applied to the MCU, the applied voltage exceeds a permitted voltage range of the MCU, thereby causing an erroneous operation of the MCU. Accordingly, in order to adjust the voltage of the battery 10 applied to the second resistor unit 120 to a value within the range permittable by the MCU, the voltage V of the battery 10 may be a value obtained by multiplying the size of the actual voltage C of the battery by the predetermined partial pressure ratio D.

Herein, the predetermined partial pressure ratio D may mean a ratio by which the voltage C of the battery 10 is distributed through voltage distribution, and a value of the partial pressure ratio may be set according to the kind and performance of the used MCU.

Next, the control unit 160 may calculate insulation resistance between the negative terminal of the battery 10 and the chassis 20 based on Equation 2 below.

$$R_P = \frac{R_G \cdot (V/V_{GE} - 1) \cdot R_f \cdot \left(\frac{(V/V_{GEF} - 1)}{V/V_{GE} - 1} - 1\right)}{R_G - (V/V_{GE} - 1) \cdot R_f \cdot \left(\frac{(V/V_{GEF} - 1)}{V/V_{GE} - 1} - 1\right)} \quad \langle \text{Equation 2} \rangle$$

Herein, $R_P$ is insulation resistance between the negative terminal of the battery 10 and the chassis 20.

Equation 2 by which the insulation resistance $R_P$ between the negative terminal of the battery 10 and the chassis 20 may be calculated may be derived by erasing X and Y by combining Equations 4, 7, and 10 among Equations 3 to 10 and organizing the combined equation based on $R_P$.

That is, the control unit 160 may calculate insulation resistance between the negative terminal of the battery 10 and the chassis 20 by putting the voltage V of the battery 10, the voltage $V_{GE}$ of the battery applied to the second resistor unit 120 when the conduction states of the first and second resistor units 110 and 120 are the on-states, and the voltage $V_{GEF}$ of the battery 10 applied to the second resistor unit 120 when the conduction states of the first to third resistor units 110 to 130 are the on-states measured by the voltage measuring unit into foregoing Equation 2. Hereinafter, a method of calculating insulation resistance by using the insulation resistance calculating system 100 according to the exemplary embodiment of the present invention will be described with reference to FIG. 4.

FIG. 4 is a flowchart for describing a series of processes for calculating insulation resistance between a positive terminal and a negative terminal of a battery and a chassis by using the insulation resistance calculating system 100 according to the exemplary embodiment of the present invention.

Referring to FIG. 4, first, a voltage of a battery starts to be measured in the state where the first to third resistor units are in the off-states (S110). After operation S110, the conduction states of the first resistor unit and the second resistor unit are changed to the on-states (S120), and a voltage applied to the second resistor unit is measured (S130). Next, a conduction state of the third resistor unit is changed to the on-state (S140), and a voltage applied to the second resistor unit is measured (S150). Further, an average voltage of the battery is calculated based on the voltage of the battery measured in operation S110 (S160).

Insulation resistance between the positive terminal and the negative terminal of the battery and the chassis is calculated based on the voltage of the battery applied to the second resistor unit when the conduction states of the first and second resistor units are the on-states, the voltage of the battery applied to the second resistor unit when the conduction states of the first to third resistor units are the on-states, and the average voltage of the battery measured and calculated in operations S130, S150, and S160. After operation S170, the conduction state of the third resistor unit is changed to the off-state (S180).

Herein, operations S110 and S120, operations S130 and S140, operations S150 to S180 and S110, and operations S130, S140, and S170 may be grouped each, and the operations included in the group may be simultaneously performed. For example, when the group including operations S130, S140, and S170 is performed, operations S130, S140, and S170 may be simultaneously performed.

In another exemplary embodiment, when the group including operations S130, S140, and S170 is performed, operations may be sequentially performed based on an order in which the operations are registered in the corresponding group.

Further, operation S110 is performed again after the operations from operation S110 to S180 are performed, and then only the group including operations S130, S140, and S170 and the group including operations S150 to S180 and S110 are repeatedly performed, thereby preventing an unnecessary operation from being repeated and decreasing time.

The method of calculating insulation resistance has been described with reference to the flowchart illustrated in the drawing. For the simple description, the method is illustrated and described with the series of blocks, but the present invention is not limited to the order of the blocks, and some blocks may occur in a different order from the order illustrated and described in the present specification or may occur with other blocks at the same time, and various other branches, a flow path, and orders of the blocks achieving the same or similar result may be implemented. Further, for the implementation of the method described in the present specification, all of the illustrated blocks may not be required.

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

The invention claimed is:

1. A system for calculating insulation resistance, the system comprising:
a first resistor unit configured to switchably connect a first node to a second node, wherein the first node is between a positive terminal of a battery and the first resistor unit, and wherein the second node is between the first resistor unit and a chassis;
a second resistor unit configured to switchably connect the second node to a third node, wherein the second node is between the second resistor unit and the chassis, and wherein the third node is between a negative terminal of the battery and the second resistor unit;
a third resistor unit configured to switchably connect the second node to the third node, wherein the second node is between the third resistor unit and the chassis, wherein the third node is negative terminal of the battery and the third resistor unit, and wherein the third resistor unit and the second resistor unit are in parallel between the second node and the third node; and
a control unit configured to control conduction states of the first, second and third resistor units,
wherein the control unit is further configured to calculate an insulation resistance between the positive terminal of the battery and the chassis, and an insulation resistance between the negative terminal of the battery and the chassis, relative to a voltage of a negative terminal side of the battery, based at least in part on (i) a first voltage difference between the second node and third node when the second node and the third node are connected through only the second resistor unit and (ii) a second voltage difference between the second node and third node when the second node and the third node are connected through both the second resistor unit and the third resistor unit.

2. The system of claim 1, further comprising:
a voltage measuring unit configured to measure a voltage of the battery applied to the second resistor unit according to the conduction states of the first, second and third resistor units; and
a storage unit configured to store the measured first voltage difference and the measured second voltage difference.

3. The system of claim 2, wherein the voltage measuring unit is configured to sequentially measure a voltage of the battery, the first voltage difference, and the second voltage difference, and
the control unit is configured to control the voltage measuring unit so as to measure the voltage of the battery at a predetermined time interval.

4. The system of claim 2, wherein the voltage measuring unit is configured to measure the voltage of the battery regardless of the conduction states of the first, second and third resistor units, and
the control unit is configured to:
calculate an average voltage of the battery based on the measured voltage of the battery, and
calculate the insulation resistance between the positive terminal of the battery and the chassis and the insulation resistance between the negative terminal of the battery and the chassis by using the calculated average voltage.

5. The system of claim 1, wherein the control unit is configured to calculate the insulation resistance between the positive terminal of the battery and the chassis based on:

$$R_n = \frac{R_E \cdot R_F \cdot \left( \frac{(V/V_{GEF} - 1)}{V/V_{GE} - 1} - 1 \right)}{R_E - R_F \cdot \left( \frac{(V/V_{GEF} - 1)}{V/V_{GE} - 1} - 1 \right)}$$

wherein, Rn is the insulation resistance between the positive terminal of the battery and the chassis, $R_E$ is a resistance value of the second resistor unit, $R_F$ is a resistance value of the third resistor unit, V is a voltage value of the battery, $V_{GEF}$ is the second voltage difference, and $V_{GE}$ is the first voltage difference.

6. The system of claim 1, wherein the control unit is configured to calculate the insulation resistance between the negative terminal of the battery and the chassis based on, $$R_P = \frac{R_G \cdot (V/V_{GE} - 1) \cdot R_f \cdot \left( \frac{(V/V_{GEF} - 1)}{V/V_{GE} - 1} - 1 \right)}{R_G - (V/V_{GE} - 1) \cdot R_f \cdot \left( \frac{(V/V_{GEF} - 1)}{V/V_{GE} - 1} - 1 \right)}$$

wherein, $R_P$ is the insulation resistance between the negative terminal of the battery and the chassis, $R_G$ is a resistance value of the first resistor unit, $R_F$ is a resistance value of the third resistor unit, V is a voltage value of the battery, $V_{GEF}$ is the second voltage difference, and $V_{GE}$ is the first voltage difference.

7. The system of claim 1, wherein each of the first, second and third resistor units includes one or more resistors and switching units, and
the one or more resistors are embedded in a battery management system (BMS) configured to manage the battery.

8. A method of calculating insulation resistance, the method comprising:
controlling a conduction state of a first resistor unit which switchably connects a first node to a second node, wherein the first node is between a positive terminal of a battery and the first resistor unit, and wherein the second node is between the first resistor unit and a chassis of a vehicle;
controlling a conduction state of a second resistor unit which switchably connects the second node to a third node, wherein the second node is between the second resistor unit and the chassis, and wherein the third node is between a negative terminal of the battery and the second resistor unit; and
controlling a conduction state of a third resistor unit which is switchably connects the second node to the third node, wherein the second node is between the third resistor unit and the chassis, wherein the third node is negative terminal of the battery and the third resistor unit, wherein the third resistor unit and the second resistor unit are in parallel between the second node and the third node;
measuring (i) a first voltage difference between the second node and third node when the second node and the third node are connected through only the second resistor unit and (ii) a second voltage difference between the second node and third node when the second node and the third node are connected through both the second resistor unit and the third resistor unit; and
calculating an insulation resistance between the positive terminal of the battery and the chassis and an insulation resistance between the negative terminal of the battery and the chassis based at least in part on the measured first voltage difference and the measured second voltage difference.

9. The method of claim 8, wherein
the method further includes storing the measured first voltage difference and the second measured voltage difference.

10. The method of claim 9, further comprising:
the measuring further includes sequentially measuring, by a voltage measuring unit, a voltage of the battery, the first voltage difference, and the second voltage difference, and
the calculating further includes controlling the voltage measuring unit so as to measure the voltage of the battery at a predetermined time interval.

11. The method of claim 8, wherein the measuring includes measuring the voltage of the battery regardless of the conduction states of the first, second and third resistor units, and
the calculating further includes calculating an average voltage of the battery based on the measured voltage of the battery, and calculating the insulation resistance between the positive terminal of the battery and the chassis and the insulation resistance between the negative terminal of the battery and the chassis by using the calculated average voltage.

12. The method of claim 8, wherein the calculating includes calculating the insulation resistance between the positive terminal of the battery and the chassis based on, $$R_n = \frac{R_E \cdot R_F \cdot \left( \frac{(V/V_{GEF} - 1)}{V/V_{GE} - 1} - 1 \right)}{R_E - R_F \cdot \left( \frac{(V/V_{GEF} - 1)}{V/V_{GE} - 1} - 1 \right)}$$

wherein, Rn is the insulation resistance between the positive terminal of the battery and the chassis, $R_E$ is a resistance value of the second resistor unit, $R_F$ is a resistance value of the third resistor unit, V is a voltage value of the battery, $V_{GEF}$ is the second voltage difference, and $V_{GE}$ is the first voltage difference.

13. The method of claim 8, wherein the calculating includes calculating the insulation resistance between the negative terminal of the battery and the chassis based on, $$R_P = \frac{R_G \cdot (V/V_{GE} - 1) \cdot R_f \cdot \left( \frac{(V/V_{GEF} - 1)}{V/V_{GE} - 1} - 1 \right)}{R_G - (V/V_{GE} - 1) \cdot R_f \cdot \left( \frac{(V/V_{GEF} - 1)}{V/V_{GE} - 1} - 1 \right)}$$

wherein, $R_P$ is the insulation resistance between the negative terminal of the battery and the chassis, $R_G$ is a resistance value of the first resistor unit, $R_F$ is a resistance value of the third resistor unit, V is a voltage value of the battery, $V_{GEF}$ is the second voltage difference, and $V_{GE}$ is the first voltage difference.

14. The method of claim 8, wherein each of the first, second and third resistor units includes one or more resistors and switching units, and the one or more resistors are embedded in a battery management system (BMS) configured to manage the battery.

\* \* \* \* \*